(12) United States Patent
Martin et al.

(10) Patent No.: US 7,331,500 B2
(45) Date of Patent: Feb. 19, 2008

(54) SOLDER BUMPS FORMATION USING SOLDER PASTE WITH SHAPE RETAINING ATTRIBUTE

(75) Inventors: Edward L. Martin, Chandler, AZ (US); Paul A. Koning, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 10/877,924

(22) Filed: Jun. 25, 2004

(65) Prior Publication Data

US 2005/0284920 A1 Dec. 29, 2005

(51) Int. Cl.
*B23K 31/00* (2006.01)
*B23K 35/34* (2006.01)

(52) U.S. Cl. ............... 228/180.21; 228/180.22; 228/203; 228/248.1; 148/24

(58) Field of Classification Search ......... 228/248.1, 228/180.1, 180.21, 180.22, 234.1; 148/23–25
See application file for complete search history.

(56) References Cited

U.S. PATENT DOCUMENTS

| | | | | |
|---|---|---|---|---|
| 5,045,127 A | * | 9/1991 | Dershem et al. ......... | 148/23 |
| 5,196,070 A | * | 3/1993 | Ables et al. ............. | 148/23 |
| 5,332,869 A | * | 7/1994 | Hagiwara ................ | 174/257 |
| 5,564,617 A | | 10/1996 | Degani et al. | |
| 5,660,321 A | | 8/1997 | Ishida et al. | |
| 5,851,311 A | * | 12/1998 | Diamant et al. ........ | 148/23 |
| 5,871,592 A | * | 2/1999 | Asagi et al. ............. | 228/180.21 |
| 5,919,317 A | * | 7/1999 | Tanahashi et al. ........ | 148/24 |
| 6,165,386 A | * | 12/2000 | Endo et al. ............... | 252/500 |
| 6,319,810 B1 | * | 11/2001 | Ochiai et al. ............. | 438/616 |
| 6,355,702 B1 | | 3/2002 | Ober et al. | |
| 6,395,995 B1 | | 5/2002 | Joy et al. | |
| 6,475,833 B2 | * | 11/2002 | Lin ........................... | 438/121 |
| 6,492,204 B1 | * | 12/2002 | Jacobs ...................... | 438/127 |
| 6,574,861 B1 | | 6/2003 | Yang et al. | |
| 6,614,003 B2 | | 9/2003 | Hembree et al. | |
| 6,644,536 B2 | * | 11/2003 | Ratificar et al. ......... | 228/234.1 |
| 2004/0089957 A1 | * | 5/2004 | Shizuno ................... | 257/787 |
| 2004/0245648 A1 | * | 12/2004 | Nagasawa et al. ....... | 257/772 |
| 2004/0250919 A1 | * | 12/2004 | Saito et al. .............. | 148/25 |

FOREIGN PATENT DOCUMENTS

| | | | | |
|---|---|---|---|---|
| JP | 06155077 A | * | 6/1994 | |
| JP | 06-196242 A | * | 7/1994 | |
| JP | 2002060462 A | * | 2/2002 | |
| JP | 2002072471 A | * | 3/2002 | |
| WO | WO 93/11906 A1 | | 6/1993 | |

OTHER PUBLICATIONS

Shirai et al., "Thermally Degradable Photocross-Linking Polymers," Department of Applied Chemistry, Graduate School of Engineering, Osaka Prefecture University, Sakai, Osaka, Japan, Abstracts of Papers, 224th ACS National Meeting, Boston, MA, Aug. 18-22, 2002, pp. 236-250.

* cited by examiner

*Primary Examiner*—Kiley Stoner
(74) *Attorney, Agent, or Firm*—Schwabe, Williamson & Wyatt, P.C.

(57) ABSTRACT

Method of forming solder bumps of an integrated circuit package is described. A solder paste is formed from a material having a characteristic that the deposited instances thereof substantially retain their geometric shape upon exposure to electromagnetic radiation.

11 Claims, 5 Drawing Sheets

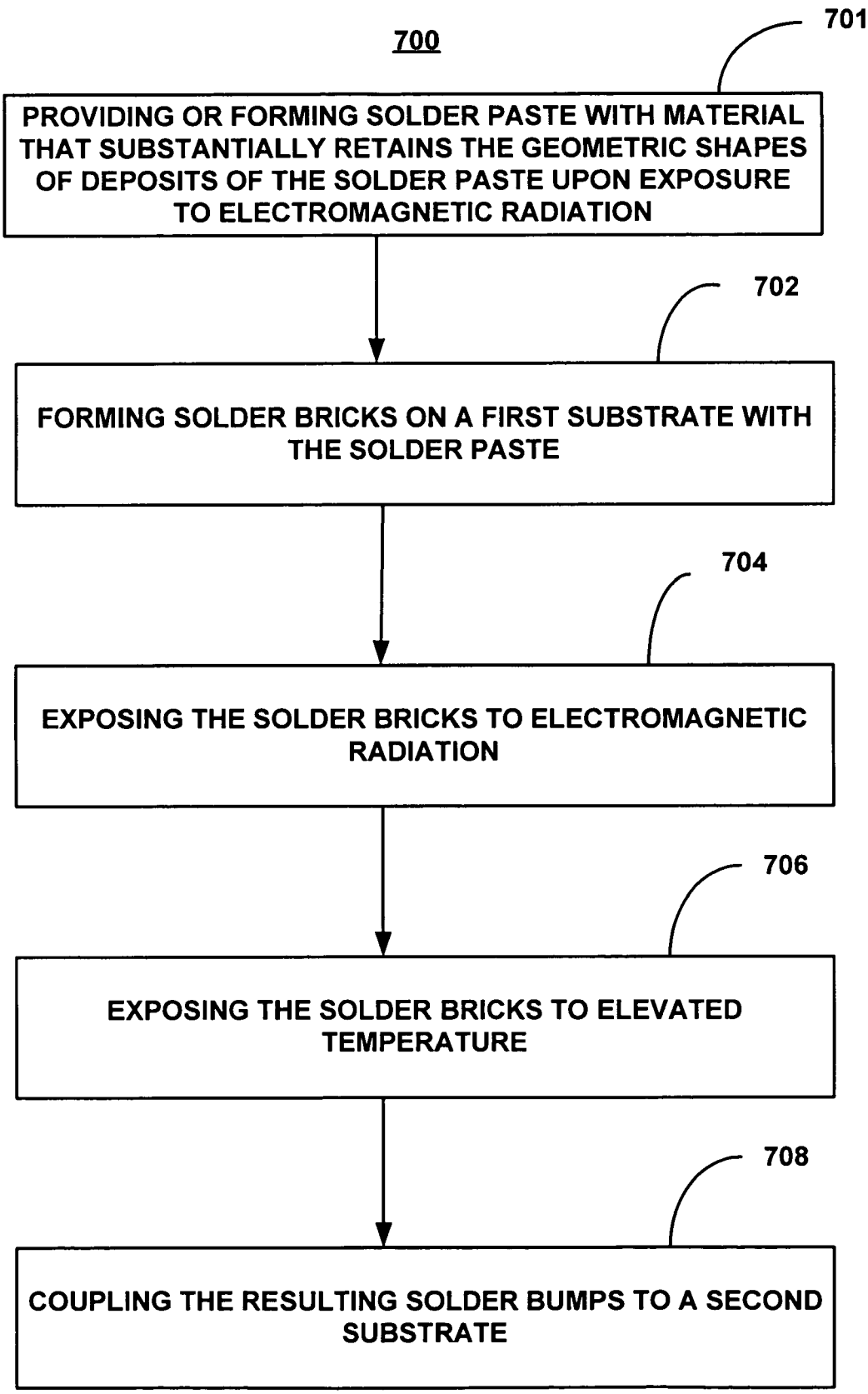

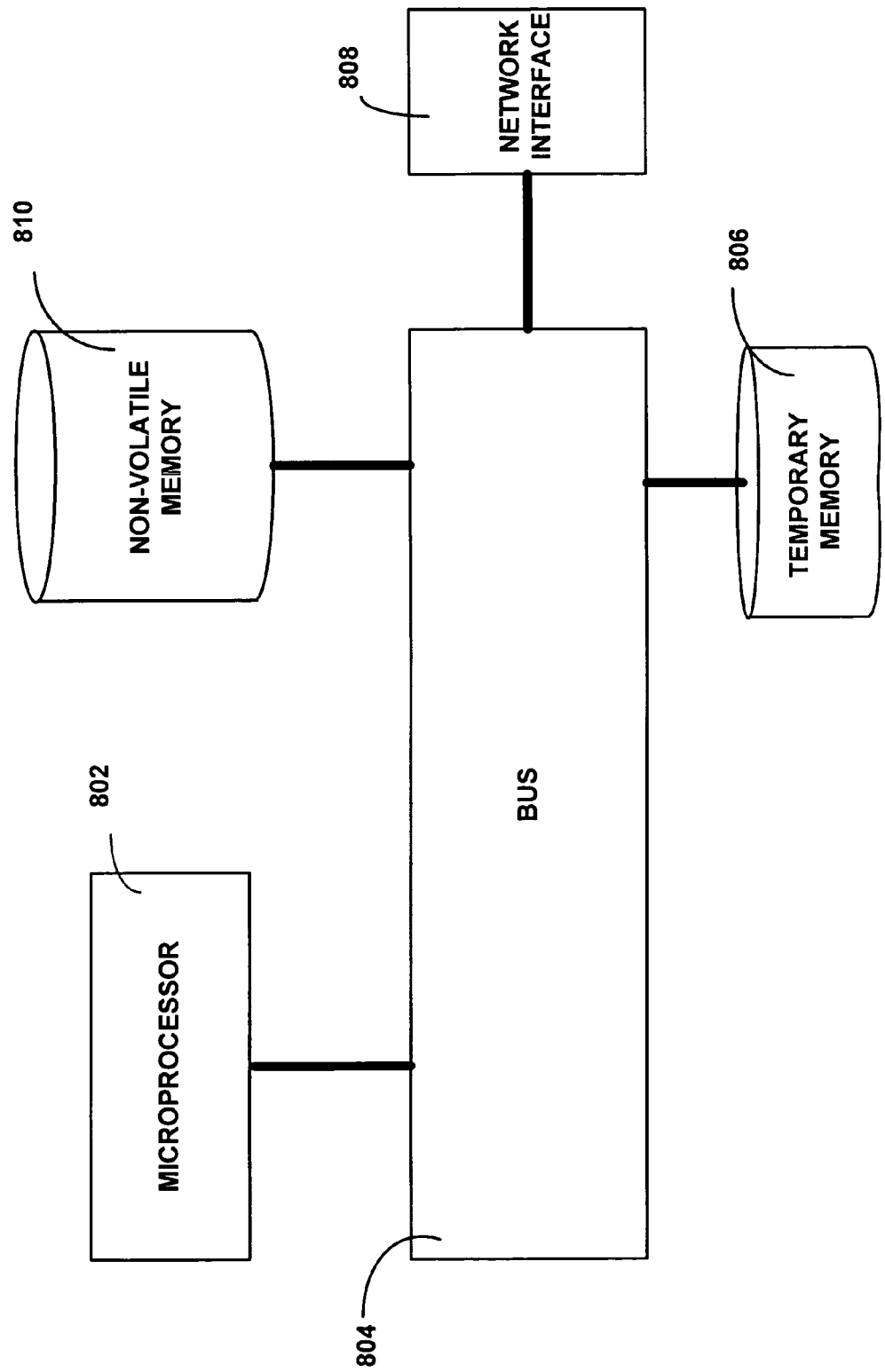

SOLDER BUMPS FORMATION USING SOLDER PASTE WITH SHAPE RETAINING ATTRIBUTE

BACKGROUND OF THE INVENTION

1. Field of the Invention

Embodiments of the present invention relate to, but are not limited to, electronic devices, and in particular, to the field of integrated circuit packaging.

2. Description of Related Art

In the field of integrated circuit technology, integrated circuit components such as microprocessors are typically assembled into packages that are physically and electrically coupled to an underlying substrate such as a printed circuit board (PCB). The packages themselves typically comprise of a carrier substrate (i.e., package substrate) that the integrated circuit (IC) component is coupled to. One or more IC components or additional substrates may be coupled to one surface of the carrier substrate while on a second surface, multiple contact points such as conductive pads are typically located. Each of these contact points represents distinct input/output (I/O) and/or power supply paths. Coupled to these conductive pads are conductive coupling links such as solder bumps, pins and spring clips that electrically couple the package to the underlying substrate.

The evolving technology relating to IC components has resulted in increasing demand for IC packaging with greater capabilities. These include a greater demand for package substrates having more I/O and/or power supply paths between the package substrate and the underlying substrate.

BRIEF DESCRIPTION OF THE DRAWINGS

Embodiments of the present invention will be described referencing the accompanying drawings in which like references denote similar elements, and in which:

FIG. 7 illustrates a process for forming solder bumps between a first and second substrate according to some embodiments; and FIG. 8 is a block diagram of an example system, according to some embodiments.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

According to various embodiments of the invention, a novel composition and method for forming solder bumps is provided, solder bumps being the conductive coupling links between, for example, a plurality of conductive pads on a first substrate and a plurality of conductive pads on a second substrate. For these embodiments, at least one of the substrates may be an integrated circuit (IC) package substrate, such as a ball grid array (BGA) package substrate, and the other substrate may be a support substrate such as a printed circuit board (PCB) substrate.

Figure 1A:
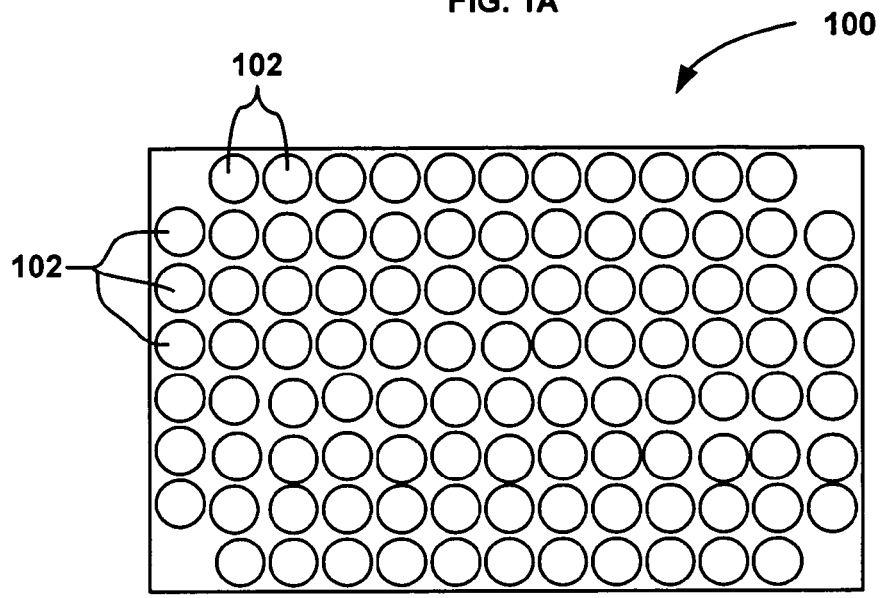
FIG. 1A illustrates a plan view of a first substrate with a plurality of conductive pads.

FIG. 1A is a plan view of a surface of a first substrate, such as an IC package substrate, having multiple conductive pads where solder bumps may be formed according to various embodiments. For these embodiments, the first substrate 100 has multiple conductive pads 102 that are proximally or closely aligned together leaving very little space between adjacent conductive pads 102. For example, the distance between the conductive pads in some cases may vary between tens of micrometers to hundreds of micrometers depending on the package type. Each of these conductive pads 102 may represent separate and distinct I/O and/or power supply paths. As a result of evolving technology relating to integrated circuit (IC) components, the number of conductive pads being crammed onto the surface of a packaging substrate has increased dramatically creating densely populated substrate surfaces. According to some embodiments, conductive coupling links, such as solder bumps or balls, may be placed onto the tightly packed conductive pads 102 without impinging on adjacent conductive coupling links.

Figure 1B:
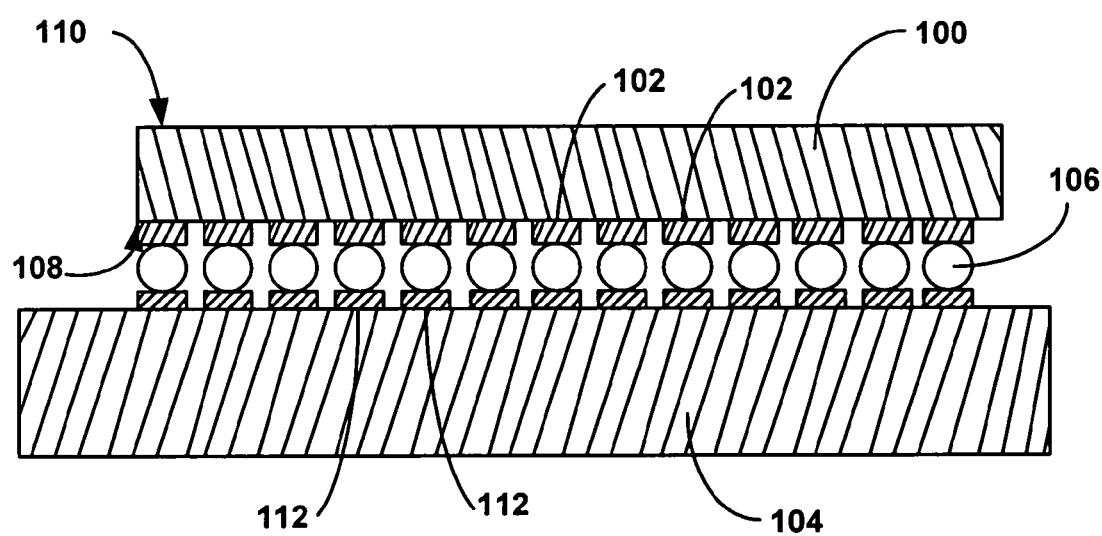
FIG. 1B illustrates a side view of the first substrate coupled to a second substrate via solder bumps according to some embodiments.

FIG. 1B is a side view of the first substrate 100 of FIG. 1A, electrically coupled to a second substrate 104, such as a printed circuit board (PCB), through multiple solder bumps 106 using a novel composition and method for forming the solder bumps according to various embodiments. For these embodiments, each of the solder bumps 106, which are proximally disposed on the second substrate 104, may be formed without impinging on adjacent solder bumps. That is, it may be desirable to form solder bumps that do not impinge or slump onto other solder bumps since each of the solder bumps represents separate I/O and/or power supply paths.

For the embodiments, each of the solder bumps 106 may be coupled to the first substrate 100 through conductive pads 102 that may in turn be coupled to one or more layers of traces and/or vias (not shown) in the first substrate 100. The conductive pads 102 may be located on a first surface 108 of the first substrate 100. IC components (not shown), such as, for example, microprocessors and memory devices, may be located on the second surface 110 of the first substrate 100.

The solder bumps 106 may be coupled to the second substrate 104 via mounting pads (i.e., conductive pads) 112, which are contact pads that electrically couple the solder bumps 106 to the second substrate 104. In some embodiments, each of the solder bumps 102 may represent a distinct I/O and/or power supply path. Although the solder bumps 106 may be tightly packed together, each of the solder bumps 106 may be formed without impinging on adjacent solder bumps, according to some embodiments.

Figure 2:
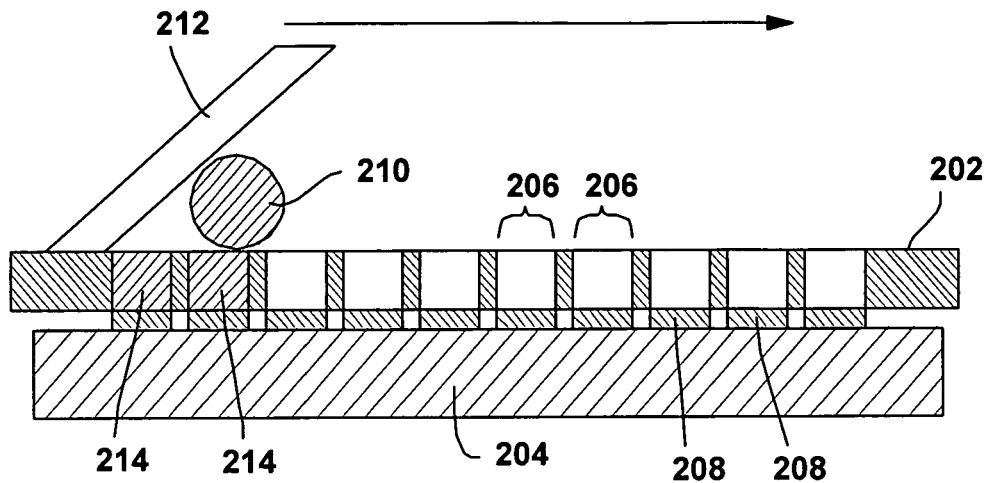
FIG. 2 illustrates a stage of a process for simultaneously forming solder bricks according to some embodiments.

FIGS. 2 to 6 depicts various stages of a process for forming solder bumps on a first substrate according to various embodiments. Referring to FIG. 2, a stage of the process for forming solder bumps by simultaneously forming a plurality of solder bricks with solder paste on a first substrate is depicted according to some embodiments. The solder bricks are solder deposits that may be used, for example, to form the solder bumps. The stage depicted in FIG. 2 (as well as FIG. 3) is related to a stencil printing process for simultaneously forming solder bricks in accordance with one embodiment. For the embodiment, a stencil mask 202 may be placed on top of a first substrate 204. The stencil mask 202, comprising multiple apertures 206, may be aligned over multiple metallized solderable surfaces 208 on the first substrate 204. The metallized solderable surfaces 208 may be placed on top of contact pads to promote formation of the solder balls or bricks on the pads. A roll of solder paste ("solder paste") 210 may be placed at one end of the stencil mask 202. A squeegee 212 may then be placed against the solder paste 210 and dragged along on the surface of the stencil mask 202 in a direction that forces the solder paste roll material into the apertures 206. In doing so, solder bricks 214 may be formed.

The stencil mask 202, in accordance with various embodiments, may comprise one or more arrays of apertures 206, each array further comprising of rows and columns of apertures 206. In some embodiments, the solder paste 210 may have a rod-like or a roll shape. For these embodiments, the squeegee 212 may be an elongated component that resembles, for example, the blade of a windshield wiper. Thus, as the squeegee 212 is being pulled or pushed across the face of the stencil mask 202, at any given moment, a row (or column) of apertures 202 may be filled with the solder paste roll material.

The first substrate 204 may be, for example, an IC packaging substrate such as for example, a ball grid array (BGA), a land grid array (LGA), an organic land grid array (OLGA), a ceramic ball grid array (CBGA), a flexible tape, or a PCB substrate. The first substrate 204 may comprise multiple layers including for example, dielectric and ceramic materials. The first substrate 204 may have multiple metallized solderable surfaces 208 where solder bumps may be formed. Each of the metallized solderable surfaces 208 may represent a contact point that is electrically coupled to, for example, vias and/or traces (not shown). These vias and/or traces may further be coupled to other vias, traces and/or IC components. The metallized solderable surfaces 208 may comprise conductive metals such as gold, nickel, copper and the like. Note that although the solder bricks 214 in FIG. 2 are being formed on the first substrate 204, such as a LGA or a BGA substrate, in other embodiments, the solder bricks 214 may be formed on a second substrate such as a PCB substrate In certain instances, the solder paste 210 may be deposited to form solder paste deposits or deposition instances, such as solder bricks 214, according to various embodiments. For these embodiments, the solder paste 210 used to form the solder paste bricks 214 may be made of a material that has the property of substantially retaining its geometric shape upon exposure to electromagnetic radiation according to some embodiments. That is, the resulting solder paste bricks 214 (i.e., solder brick instances) when exposed to electromagnetic radiation or other reactive environments may increase its rigidity such that its geometric shape may be substantially retained. In various embodiments, the material used to form the solder paste 210 may comprise an additive that may allow the resulting solder bricks 214 to substantially retain their geometric shapes at least temporarily after the stencil mask 202 has been removed. By substantially retaining their geometric shapes, the solder bricks 214 may not slump, and resultantly impinge on one or more of the adjacent solder bricks according to various embodiments.

According to one embodiment, the solder paste 210 may be initially formed with a solder base comprising about 90 percent metal powder and 10 percent solder flux. For the embodiment, the metal powder may comprise about 63 percent tin (Sn) and 37 percent lead (Pb). In other embodiments however, the percentages of the solder paste base components may be varied. In yet other embodiments, other types of metals may be used.

According to various embodiments, in addition to the solder base, an additive may be included to the solder base in forming the solder paste 210. For these embodiments, the additive may have two characteristics that may facilitate the formation of the subsequent solder bumps (i.e., solder balls). First, the additive may have properties that increase the ability of the solder bricks 214 that are formed from the solder paste 210 to substantially retain their geometric shape after the stencil mask 202 has been removed. Second, the additive may decompose at elevated temperature thus allowing the solder bricks 214 to reflow and bond with the underlying metallized solderable surfaces 208 during, for example, subsequent reflow operations.

According to various embodiments, the additive may be a polymer. For example, the polymer types that are listed in Table 1 below may be used for such purposes:

TABLE 1 poly(caprolactone)
poly(alphamethyl styrene)
poly(propylene oxide)
poly(propylene glycol)
poly(oxymethylene)
poly(ethylene carbonate)
poly(propylene carbonate)
bismaleimides These polymers may have thermally degradable backbones in the range of common solder reflow temperatures. Further, such polymers may also be made to be photo-crosslinakable by simple grafting of crosslinkable moieties to these polymer types. Examples of such moiety include, for example, acrylates or methyacrylates crosslinkable by photo-radical initiators, aromatic epoxy crosslinkable by photo-anionic initiators, and aliphatic epoxies, crosslinkable by photo-cationic initiators. The exact degradation temperature of the polymer formulation may be dictated by the reflow temperature of the solder used, the molecular weight of the degradable polymer, the formulation of the crosslinkable moiety and photoinitiator used. Another way to produce a thermally degradable photocrosslinkable polymer is to use a thermally stable polymer, which is soluble in the solder paste flux, and have the crosslinkable units be thermally degradable.

These polymer additives may allow the solder paste to initially retain its low viscosity characteristics thus allowing, for example, the roll of solder paste 210 to fill the apertures 206 of the stencil mask 202 with relative ease. After the solder bricks 214 are formed, such additives may allow the solder bricks 214 to retain their geometric shape by increasing the rigidity of the surface of the solder bricks 214 upon, for example, exposure to electromagnetic radiation such as ultraviolet (UV) radiation. When exposed to electromagnetic radiation, these additives, or in the case of polymers, may crosslink forming molecular bonds that may prevent the solder bricks from warping or slumping after the stencil mask 202 has been removed.

Figure 3:
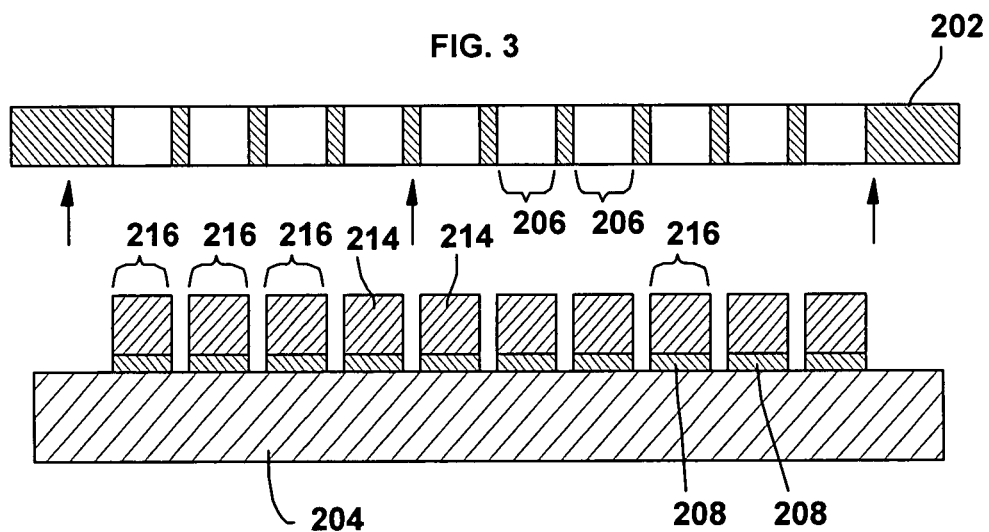
FIG. 3 illustrates a stage of a process for simultaneously forming solder bricks according to some embodiments.

Referring to FIG. 3 depicting the stencil mask 202 of FIG. 2 being removed from the surface of the first substrate 204 according to some embodiments. For the embodiments, the stencil mask 202 is raised vertically away from the first substrate 204 leaving behind solder bricks 214 on tops of the metallized solderable surfaces 208. The resulting solder bricks 214 formed having geometric shapes 216 that do not impinge upon adjacent solder bricks at least temporarily. The geometric shapes 216 of the solder bricks 214 may be maintained at least temporarily as a result of, for example, the natural viscosity of the solder base material (i.e., metal powder and flux) that the solder bricks 214 are made from. Since the natural viscosity of the solder base material in some embodiments may be relatively low, the geometric shapes 216 of the solder bricks 214 may only last temporarily. Therefore, in these embodiments, it may be desirable to expose the solder bricks 214 to electromagnetic radiation soon after or during the formation of the solder bricks 214.

Figure 4:
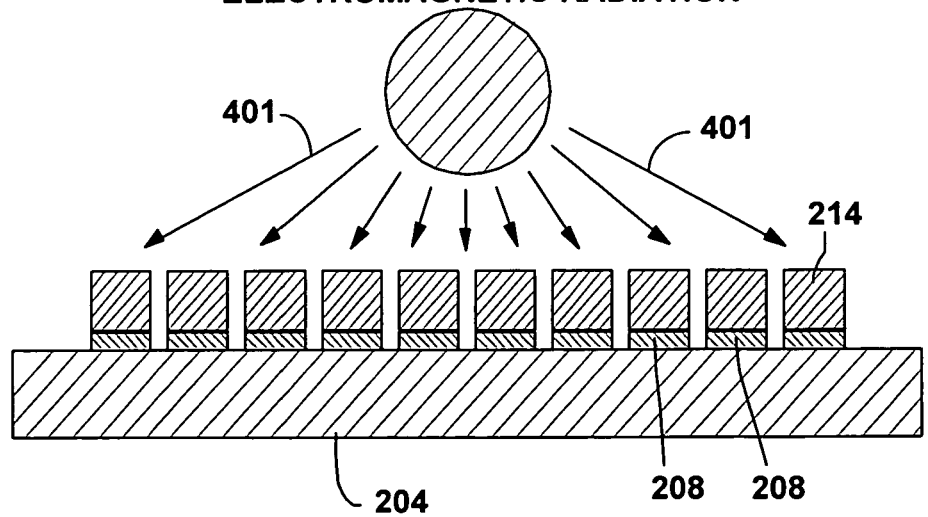
FIG. 4 illustrates a stage of a process for forming solder bricks that substantially retain their geometric shapes using electromagnetic radiation according to some embodiments.

FIG. 4 depicts the solder bricks 214 being exposed to electromagnetic radiation 401 after the stencil mask 202 has been removed according to various embodiments. For these embodiments, the electromagnetic radiation 401 may make the solder bricks 214 more rigid thus allowing the solder bricks 214 to substantially retain their geometric shapes and not impinge on adjacent solder bricks. As previously described, if the additive in the solder bricks 214 is a polymer then the polymers may crosslink forming molecular bonds that may prevent the solder bricks from slumping. In some embodiments, the crosslinking or polymerization of the additive may occur at the surfaces of the solder bricks 214. This may result in increasing the viscosity of the solder paste material on the surfaces of the solder bricks 214 and may act as a semi-rigid barrier to prevent the solder bricks from slumping. As a result, the solder bricks 214 may substantially retain their geometric shapes during subsequent processes such as reflow processes.

In various embodiments, the solder bricks 214 may be exposed to the electromagnetic radiation 401 while the stencil mask 202 is being lifted off of the surface of the first substrate 204. In other embodiments, the solder bricks 214 may be exposed to the electromagnetic radiation 401 after the stencil mask 202 has been completely removed. In yet other embodiments, the solder bricks 214 may be exposed to the electromagnetic radiation 401 while still within the apertures 206 of the stencil mask 202 if the solder bricks 214 is made of non-sticking type of material and the stencil mask 202 is transparent to the electromagnetic radiation. In addition to ultraviolet radiation, other types of electromagnetic radiation, for example, infrared, visible, and the like, may be used in various embodiments.

In one embodiment, machinery that is used for stenciling or printing the solder bricks 214 onto the first substrate 204 may include, in addition to the stencil mask 202, a source for the electromagnetic radiation. Such architecture may assure that the solder bricks 214 are exposed to the electromagnetic radiation during the removal of the stencil mask 202 or immediately afterwards preventing the solder bricks 214 from slumping and impinging onto adjacent solder bricks.

Figure 5:
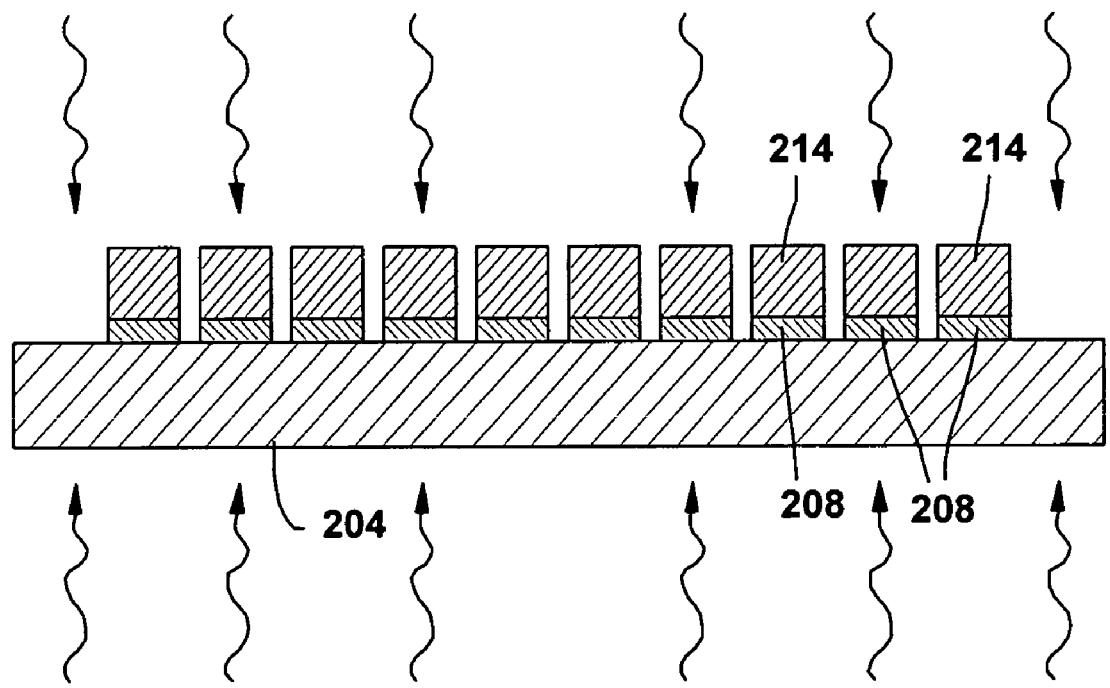
FIG. 5 illustrates a stage of a process for forming solder bumps according to some embodiments.

Referring to FIG. 5 depicting the first substrate 204 and the solder bricks 214 being exposed to elevated temperatures according to various embodiments. For the embodiments, after the solder bricks 214 have been exposed to the electromagnetic radiation 401, the solder bricks 214 along with the first substrate 204 may be exposed to elevated temperatures to reflow the solder bricks 214. The reflow of the solder bricks 214 may be performed in order to bond the solder bricks 214 to the metallized solderable surfaces 208. In some embodiments, the additive in the solder bricks 214 may decompose when exposed to the elevated temperatures. For example, if the additive is a polymer, the additive may decompose and may be displaced through a combination of reactions with the solder flux and the denser solder alloy filler metal flow. The decomposition of the additive may facilitate the reflow and bonding of the solder bricks 214 to the metallized solderable surfaces 208. After decomposing, inert amounts of residual by-products of the additive may remain, for example, on the surface of the first substrate 204 and/or on the resulting solder bumps.

According to some embodiments, the reflow process may be performed using a reflow oven. For example, in one embodiment, the first substrate 204 and solder bricks 214, which in this case comprises of a 63Sn/37Pb alloy, may be placed into the reflow oven operating at a temperature of 190-210 degrees Celsius for about between 60-120 seconds above the eutectic temperature of 183 degrees Celsius.

Figure 6:
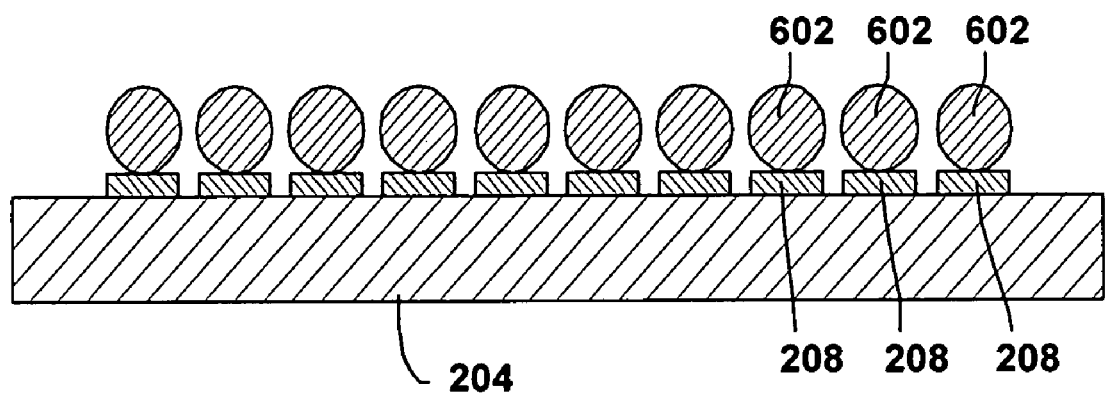
FIG. 6 illustrates a stage of a process for forming solder bumps according to some embodiments.

FIG. 6 depicts solder bumps 602 that are formed from the solder bricks 214 of FIG. 5 after being exposed to elevated temperatures, according to various embodiments. The solder bumps 602 may form in the shape of spheres on top of the metallized solderable surfaces 208. Each of the solder bumps 602 being isolated from the other solder bumps. Additional packaging processes may be performed after the formation of the solder bumps 602 in various embodiments. For example, processes for coupling the solder bumps 602 to mounting pads on a second substrate, such as a PCB substrate, may be performed. Such processes may include, for example, placing the solder bumps 602 coupled to the first substrate 204 onto the mounting pads of the second substrate. The entire assembly may then placed into a reflow oven for further reflow of the solder bumps 602 in order to bond the solder bumps 602 to mounting pads on the second substrate. Note that if the first substrate 208 is part of a land grid array package than the first substrate 208, along with the solder bumps 602, may be directly coupled to, for example a PCB substrate without socket mounts. In any event, the resulting package is depicted, for example, in FIG. 1B. In other embodiments, the solder bumps may be initially formed on a PCB substrate instead of the IC package substrate as provided in the above embodiments. For these embodiments, once the solder bumps have been formed on the PCB substrate, an IC package may be coupled to the solder bumps, using for example, addition reflow processes.

FIG. 7 depicts a process for forming solder bumps according to some embodiments. The process 700 generally reflects the process depicted by FIGS. 2 to 6. The process 700 may begin when a solder paste 210 is provided or formed with a material that substantially retains the geometric shapes of deposits of the solder paste, such as solder bricks 214, upon exposure to electromagnetic radiation at 701. As described previously, the material may comprise of a solder base with an additive, such as a polymer, that forms molecular bonds when exposed to electromagnetic radiation. After the solder paste has been formed, a plurality of solder bricks 214 is formed on a first substrate 204 with the solder paste 210 at 702. The formation of the plurality of solder bricks 214 may occur simultaneously using, for example, the stenciling and printing process as described previously. After forming the solder bricks 214, the solder bricks 214 may be exposed to electromagnetic radiation 401 at 704. This may assure that the solder bricks 214 do not slump and thus impinge on adjacent solder bricks. In order to assure that each of the solder bricks 214 do not indeed slump and thus impinge on adjacent solder bricks, the solder bricks 214 may be exposed to the electromagnetic radiation 401 during the formation or immediately after the solder bricks 214 are formed. The solder bricks 214 (along with the first substrate 204) may then be exposed to elevated temperatures to bond the solder bricks 214 to conductive pads 208 on the surface of the first substrate 204 at 706. As a result, solder bumps 602 are bonded to the first substrate 204. In some embodiments, the additive in the solder bricks 214 may decompose while the solder bricks 214 are being exposed to the elevated temperature to assure, for example, good bonding. Finally, the solder bumps 602 may be coupled or bonded to, for example, mounting pads on a second substrate such as a PCB substrate by employing additional reflow processes at 708.

Referring now to FIG. 8, a system 800 in accordance with some embodiments is shown. The system 800 includes a microprocessor 802 that may be coupled to a bus 804. The system 800 may further include temporary memory 806, a network interface 808, and an optional non-volatile memory 810. One or more of the above enumerated elements, such as microprocessor 802, temporary memory 806, non-volatile memory 810, and so forth, may be part of a package that includes the novel solder bumps formed using the novel composition and process described above.

Depending on the applications, the system 800 may include other components, including but not limited to chipsets, RF transceivers, mass storage (such as hard disk, compact disk (CD), digital versatile disk (DVD), graphical or mathematic co-processors, and so forth.

One or more of the system components may be located on a single chip such as a SOC. In various embodiments, the system 800 may be a personal digital assistant (PDA), a wireless mobile phone, a tablet computing device, a laptop computing device, a desktop computing device, a set-top box, an entertainment control unit, a digital camera, a digital video recorder, a CD player, a DVD player, a network server, or device of the like.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the embodiments of the present invention. Therefore, it is manifestly intended that embodiments of this invention be limited only by the claims.

What is claimed is:

1. A method, comprising: providing a solder paste formed with a material having a characteristic of its deposition instances substantially retaining their geometric shapes upon exposure to electromagnetic radiation, the material including a poly(caprolactone) additive having a property of enabling rigidity of a surface of deposition instances of the solder paste to be increased upon exposure to the electromagnetic radiation, the additive further having a property of decomposing at a temperature at which deposition instances of the solder paste reflow; forming a plurality of solder brick instances from the solder paste on a substrate; exposing the plurality of solder brick instances to electromagnetic radiation to increase rigidity of the plurality of solder brick instances; and reflowing the plurality of solder brick instances to form a plurality of solder bumps.

2. The method of claim 1, wherein forming the plurality of solder brick instances comprises stencil printing the solder paste onto the substrate.

3. The method of claim 1, wherein exposing the solder bricks to electromagnetic radiation comprises exposing the solder bricks to ultraviolet radiation.

4. The method of claim 1, wherein forming the plurality of solder brick instances comprises forming the plurality of solder brick instances on metallized solderable surfaces of the substrate.

5. The method of claim 1, wherein forming the plurality of solder brick instances comprises forming the plurality of solder brick instances on a substrate selected from the substrate group consisting of a ball grid array (BGA) substrate and a land grid array (LGA) substrate.

6. The method of claim 1, further comprising coupling the solder bumps to mounting pads on another substrate.

7. The method of claim 1, wherein exposing the solder bricks comprises exposing the solder bricks to ultraviolet radiation.

8. The method of claim 1, wherein providing the plurality of solder bricks comprises depositing the plurality of solder bricks on to the substrate by stencil printing.

9. The method of claim 1, wherein providing the plurality of solder bricks comprises depositing the plurality of solder bricks onto conductive pads of the substrate.

10. The method of claim 5, wherein the substrate consists of a ball grid array (BGA) substrate.

11. The method of claim 5, wherein the substrate consists of a land grid array (LGA) substrate.

* * * * *